United States Patent [19]

Saitoh et al.

[11] Patent Number: 4,812,328

[45] Date of Patent: Mar. 14, 1989

[54] METHOD FOR FORMING DEPOSITED FILM

[75] Inventors: Keishi Saitoh, Nabari; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 945,689

[22] Filed: Dec. 23, 1986

[30] Foreign Application Priority Data

Dec. 25, 1985 [JP] Japan ................ 60-295303

[51] Int. Cl.$^4$ ........................ B05D 5/6; B05D 5/12
[52] U.S. Cl. ........................ 427/69; 427/70; 427/255; 427/255.2; 427/255.3; 427/255.7
[58] Field of Search ........... 427/69, 70, 85, 86, 427/87, 95, 255.2, 255.3, 255, 38, 35, 255.1, 255.7

[56] References Cited

U.S. PATENT DOCUMENTS

| | | | |
|---|---|---|---|
| Re. 31,708 | 10/1984 | Gordon | 427/126.2 |
| 3,473,978 | 10/1969 | Jackson et al. | 427/255.7 |
| 3,888,705 | 6/1975 | Fletcher et al. | 148/175 |
| 4,146,657 | 3/1979 | Gordon | 427/126 |
| 4,239,811 | 12/1980 | Kemlage | 427/95 |
| 4,357,179 | 11/1982 | Adams et al. | 427/95 |
| 4,402,762 | 9/1983 | John et al. | 427/87 |
| 4,421,592 | 12/1983 | Shaskus et al. | 156/613 |
| 4,448,801 | 5/1984 | Fukuda et al. | 427/87 |
| 4,462,847 | 7/1984 | Thompson et al. | 148/174 |
| 4,504,518 | 3/1985 | Ovshinsky et al. | 427/86 |
| 4,522,663 | 6/1985 | Ovshinsky et al. | 427/86 |
| 4,532,199 | 7/1985 | Ueno et al. | 430/128 |
| 4,554,180 | 11/1985 | Hirooka | 427/248.1 |
| 4,615,905 | 10/1986 | Ovshinsky et al. | 427/86 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |

FOREIGN PATENT DOCUMENTS

| | | | |
|---|---|---|---|
| 74212 | 3/1983 | European Pat. Off. | 427/248.1 |
| 90586A | 10/1983 | European Pat. Off. | 427/38 |
| 59-199035 | 12/1984 | Japan | 427/38 |
| 60-43819 | 8/1985 | Japan | 427/38 |
| 2038086 | 7/1980 | United Kingdom | 427/87 |
| 2148328 | 5/1985 | United Kingdom | 427/255.2 |

OTHER PUBLICATIONS

Brodsky et al., 22 IBM Technical Disclosure Bulletin 3391 (Jan. 1980).
Inoue, Appl. Phys, Lett. 43(8), 15 Oct. 83, p. 774.
Ohnishi et al., Proceedings, 6th E.C. Photovoltaic Solar Energy Conference, London, Apr. 15-19, 1985.
Sakai et al., Proceedings, 6th E.C. Photovoltaic Solar Energy Conference, Longon, Apr. 15-19, 1985.

*Primary Examiner*—Sadie Childs
*Attorney, Agent, or Firm*—Fitzpatrick, Cella, Harper & Scinto

[57] ABSTRACT

A method for forming a deposited film by introducing a gaseous starting material for formation of a deposited film and a gaseous halogenic oxidizing agent having the property of oxidation action on said starting material separately from each other into a reaction space to form a deposited film according to a chemical reaction, which comprises activating previously a gaseous substance (B) for formation of a band gap controller in an activation space to form an activated species and introducing said activated species into the reaction space to form a deposited film controlled in band gap on a substrate existing in the film forming space.

20 Claims, 3 Drawing Sheets

METHOD FOR FORMING DEPOSITED FILM

BACKGROUND OF THE INVENTION

1. Field of the Invention

This invention relates to a method for formation of a functional film, particularly a semiconductive deposited film which is useful for uses such as semiconductor device, photosensitive device for electrophotography, electronic device such as optical input sensor device for optical image inputting device, etc.

2. Description of the Prior Art

Hitherto, for functional films, especially amorphous or polycrystalline semiconductive films, individually suitable film forming methods have been employed from the standpoint of desired physical characteristics, uses, etc.

For example, for formation of silicon type deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon deposited film according to the plasma CVD method which has been generalized up to now is considerably complicated as compared with the conventional CVD method, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). Because of the combination of such a large number of parameters, the plasma may sometimes become unstable state, whereby marked deleterious influences were exerted frequently on the deposited film formed. Besides, the characteristic parameters of the device must be selected for each device and therefore under the present situation it has been difficult to generalize the production conditions.

On the other hand, for the silicon type deposited film to exhibit sufficiently satisfactory electric and optical characteristics for respective uses, it is now accepted the best to form it according to the plasma CVD method.

However, depending on the application use of the silicon type deposited film, bulk production with reproducibility must be attempted with full satisfaction of enlargement of area, uniformity of film thickness as well as uniformity of film quality, and therefore in formation of a silicon type deposited film according to the plasma CVD method, enormous installation investment is required for a bulk production device and also management items for such bulk production become complicated, with a width of management tolerance being narrow, and the control of the device being severe. These are pointed out as the problems to be improved in the future.

Also, in the case of the plasma CVD method, since plasma is directly generated by high frequency or microwave, etc., in the film forming space in which a substrate on which film is formed is arranged, electrons or a number of ion species generated may cause damage to the film in the film forming process to result in inferior film quality or non-uniformization of film quality.

As an improvement of this point, the indirect plasma CVD method has been proposed.

The indirect plasma CVD method has elaborated on the use of the principal substance for formation of deposited film by forming an activated species of the principal substance for formation of deposited film by microwave, etc., at an upstream position apart from the film forming space and transporting said activated species to the film forming space.

However, even by such a plasma CVD method, transport of activated species is essentially required and therefore the activated species effective for film formation must have long life, whereby kinds of gases which can be employed are spontaneously limited, thus failing to give various deposited films. Also, enormous energy is required for generation of plasma, and generation of the chemical species effective for film formation and their amounts cannot be essentially placed under simple management. Thus, various problems remain to be solved.

As contrasted to the plasma CVD method, the optical CVD method is advantageous in that no ion species or electrons are generated which cause damage to the film quality during film formation. However, there are problems such that the light source does not include so much kinds, that the wavelength of the light source tends to be toward UV-ray range, that a large scale light source and its power source are required in the case of industrialization, that the window for permitting the light from the light source to be introduced into the film forming space is coated with a film during film formation to result in lowering in dose during film formation, which may further lead to shut-down of the light from the light source into the film forming space.

As described above, in formation of silicon type deposited film, the points to be solved still remain, and it has been earnestly desired to develop a method for forming a deposited film which is capable of bulk production by attempting to save energy by means of a device of low cost, while maintaining the characteristics as well as uniformity which are practicably available. Especially, the above points are highly demanded when forming a semiconductor film while adding a band gap controller.

SUMMARY OF THE INVENTION

An object of the present invention is to provide a novel method for forming a deposited film with removing the drawbacks of the method for forming deposited films as described above and at the same time without use of the formation method of the prior art.

Another object of the present invention is to provide a method for forming a deposited film capable of saving energy and at the same time of obtaining a semiconductive deposited film added with a band gap controller and with uniform characteristics over a large area, with easy management of film quality.

Still another object of the present invention is to provide a method for forming a deposited film by which a film excellent in productivity and bulk productivity, having high quality as well as excellent physical characteristics such as electrical, optical, and semiconductor characteristics can be easily obtained.

The method for forming a deposited film of the present invention which can accomplish the above objects is a method for forming a deposited film by introducing a gaseous starting material for formation of a deposited film and a gaseous halogenic oxidizing agent having the property of oxidation action on said starting material separately from each other into a reaction space to form a deposited film according to a chemical reaction, which comprises activating previously a gaseous substance (B) for formation of a band gap controller in an activation space to form an activated species and introducing said activated species into the reaction space to form a deposited film added with a band gap controller on a substrate existing in the film forming space which is spatially connected to the reaction space.

DESCRIPTION OF THE PREFERRED EMBODIMENT

According to the method for forming a deposited film of the present invention, simplification of management and bulk production can be effected with full satisfaction of enlargement of area, uniformity of film thickness, and uniformity of film quality simultaneously with saving energy, without requiring enormous installation investment for bulk production apparatus, and also the management items for its bulk production become clear to afford broad width of management tolerance and simple adjustment of the device.

The gaseous substance (B) containing a component for a band gap controller as the constituent which is employed in the method for forming a deposited film of the present invention, can be previously activated by discharging, light, heat energy, etc., and may be either capable of undergoing chemical reaction with a gaseous halogenic oxidizing agent or not. The gaseous substance (B) can be selected suitably as desired depending on the kind, the characteristic, use, etc., of the desired deposited film.

When the starting material for formation of a deposited film and the halogenic oxidizing agent are liquid or solid under ordinary state, they are introduced in gaseous state into the reaction space while performing bubbling with the use of carrier gas. such as Ar, He, $N_2$, $H_2$, etc., optionally with application of heat.

On the other hand, when the gaseous substance (B) is liquid or solid under ordinary state, the substance (B) is made gaseous while performing bubbling with the use of carrier gas such as Ar, He, $H_2$, etc., optionally with application of heat.

The gaseous substance (B) is previously introduced into the activation space, in which it is activated with discharge, light, heat energy, etc., followed by the introduction of the activated gaseous substance (B) (this is also referred to as "activated species" in the present specification) and/or the activated species (BA) generated from the gaseous substance (B) by an activation treatment.

During this operation, the partial pressures and mixing ratio of the activated gaseous substance (B) and/or the activated species (BA) generated from the gaseous substance(B), and the gaseous halogenic oxidizing agent in the reaction space may be set by controlling the flow rate of the carrier gas and the vapor pressures of the gaseous starting material for formation of the deposited film and the gaseous halogenic oxidizing agent.

As the starting material for formation of a deposited film to be used in the present invention, for example, if semiconductive silicon type deposited films are desired to be obtained, straight chain and branched chain silane compounds, cyclic silane compounds, etc. may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, etc.

Of course, these silicon type compounds may be used either as a single kind or as a mixture of two or more kinds.

As the substance (B) capable of forming the band gap expanding element to be used on formation of a silicon type or germanium type deposited film in the present invention, carbon containing compounds, oxygen containing compounds or nitrogen containing compounds may be employed.

Specifically, examples of carbon containing compounds may include compounds represented by the formula $C_nH_{2n+l}$ (n is a natural number) such as $C_2H_4$, $C_3H_6$, $C_4H_8$, $C_4H_{10}$, etc.; compounds represented by the general formula $C_nH_{2n}$ (n is a natural number) such as $C_2H_4$, $C_3H_6$, $C_4H_8$, etc.; and $C_2H_2$, $C_6H_6$, etc. Examples of oxygen containing compounds may include compounds such as $O_2$, $CO_2$, $NO$, $NO_2$, $N_2O$, $O_3$, $CO$, $H_2O$, $CH_3OH$, $CH_3CH_2OH$, and others. Nitrogen containing compounds may be, for example, $N_2$, $NH_3$, $N_2H_5N_3$, $N_2H_4$, $NH_4N_3$, etc.

As the substance (B) capable of forming a band gap reducing element to be used in the present invention for formation of a silicon type deposited film, for example, chain germanium compounds, tin compounds may be employed as effective ones.

Specifically, examples of chain germanium compounds may include $Ge_mH_{m+2}$ (m=1, 2, 3, 4, 5), etc. Examples of tin compound may include hydrogenated tin such as $SnH_4$, etc.

The halogenic oxidizing agent to be used in the present invention is made gaseous when introduced into the reaction space and at the same time has the property of effectively oxidizing the gaseous starting material for formation of a deposited film introduced into the reaction space by mere chemical contact therewith, including halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the activated gaseous substance (B) or the activated species (BA) generated from said gaseous substance (B), and the gas of the starting material for formation of a deposited film as described above with desired flow rate and feeding pressure are given, wherein they are mixed with and the halogenic oxidizing agents are collided against the activated gaseous substance (B), the activated species of said gaseous substance (B), and the above starting material to chemically react therewith, thereby oxidizing said activated gaseous substance (B) and/or the activated species (BA), and the above starting material to generate efficiently a plurality kinds of precursors containing precursors in an excited state. Of the precursors in an excited state and other precursors generated, at least one of them function as the feeding source for the constituent element of the deposited film formed.

The precursors generated may undergo decomposition or reaction to be converted to other precursors in an excited state or to precursors under another excited state, or alternatively in their original forms, if desired, although releasing energy to contact the substrate surface arranged in a film forming space, whereby a deposited film having a three-dimensional network structure is prepared.

As the energy level to be excited, it is preferable that the precursor in the above excited state should be subject to energy transition to a lower energy level, or alternatively it should be at an energy level accompanied with luminescence in the process of changing to another chemical species. By formation of an activated precursor including the precursor under excited state accompanied with luminescence in such a transition of energy, the deposited film forming process of the present invention proceeds with better efficiency and more save of energy to form a deposited film having uniform and better physical characteristics over the whole film surface.

For introducing the gas of the above gaseous substance (B) into the activation space, it can be introduced from a plural number of independent gas feeding sources.

In the present invention, so that the deposit film forming process may proceed smoothly to form a film of high quality and having desired physical characteristics, as the film forming factors, the kinds and combination of the starting material, the activated gaseous substance (B) or the activated species (BA) of the gaseous substance (B), and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as determined in relationship of the film forming factors related among the film forming factors as mentioned above. It is preferably 1/20 to 100/1, more preferably 1/10–50/1 in terms of flow rate ratio introduced.

The proportion of the activated gaseous substance (B) and/or the activated species (BA) obtained by the activation in the activation space and introduced into the reaction space may be set suitably as desired depending on the kind of the above gaseous starting material and the desired semiconductor characteristics of the deposited film to be prepared. It is preferably 1/100 to 500/1, more preferably 1/100 to 100/1, optimally 1/90 to 100/1 based on the above gaseous starting material.

The pressure during mixing when introduced into the reaction space may be preferably higher in order to enhance the chemical contact among the above gaseous starting material, the gaseous substance (B) and/or the activated species (BA), and the above gaseous halogenic oxidizing agent in probability. It is better to determine the optimum value suitably as desired in view of the reactivity. Although the pressure during mixing may be determined as described above, each of the pressure during introduction may be preferably $1 \times 10^{-7}$ atm to 10 atm, more preferably $1 \times 10^{-6}$ atm to 3 atm.

The pressure within the film forming space, namely the pressure in the space in which the substrate surface is effected by film formation is arranged may be set suitably as desired so that the precursors (E) under excited state generated in the reaction space and sometimes the precursors (F) formed as secondary products from said precursors (E) may contribute effectively to film formation.

The inner pressure in the film forming space, when the film forming space is continuous openly to the reaction space, can be controlled in relationship with the introduction pressures and flow rates in the reaction space of the gaseous starting material for formation of a deposited film, said substance (B), and a gaseous halogenic oxidizing agent, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only spatially different, it is possible to effect differential evacuation or provide a large scale evacuating device having sufficient evacuating capacity as described above.

As described above, the pressure in the film forming space may be determined in the relationship with the introduction pressures of the gaseous starting material, said activated gaseous substance (B) and the activated species (BA), and the gaseous halogenic oxidizing agent introduced into the reaction space. It is preferably 0.001 Torr to 100 Torr, more preferably 0.01 Torr to 30 Torr, optimally 0.05 to 10 Torr.

Further, the pressure in the activation space is intimately related with the pressure in the reaction space and it should desirably be higher than the inner pressure in the reaction space.

In the present invention, a gaseous substance (D) for forming a valence electron controller may be also added on the film formation.

The above substance (D) may be introduced into the above film forming space as mixed with either the above gaseous starting material for formation of a deposited film, the above halogenic oxidizing agent or the gaseous substance (B) for forming a band gap controller and/or the activated species (BA), or alternatively introduced into the above film forming space independently of others, taking the reactivity of the substance (D) in consideration.

Further, the above substance (D) may be activated in an activation chamber separate from the activation chamber for the substance (B) before introduction into the above film forming space.

As the material (D) to be used in the present invention, in the case of a silicon type semiconductor film and a germanium type semiconductor film, there may be employed compounds containing the p type valence electron controller, which functions as the so-called p type impurity, namely an element in the group IIIA of the periodic table such as B, Al, Ga, In, Tl, etc., and the n type valence electron controller which functions as the so-called n type impurity, namely an element in the group VA of the periodic table such as N, P, As, Sb, Bi, etc.

Specific examples may include $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc., as effective ones.

These valence electron controllers may function as the band gap controller when added in a large amount in some cases.

For introducing the gas of the above substance (D) into the reaction space, it can be introduced from a plural number of independent gas feeding sources.

In the present invention, so that the deposit film forming process may proceed smoothly to form a film of high quality and having desired physical characteristics, as the film forming factors, the kinds and combination of the starting material, the activated species of the substance (B) and/or the activated species (BA), the substance (D), and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships.

The introduction proportion of the gaseous substance (D) may be set suitably as desired depending on the kind of the above gaseous starting material and the desired semiconductor characteristics of the deposited film to be prepared. It is preferably 1/1000000 to 1/10, more preferably 1/100000 to 1/20, optimally 1/100000 to 1/50 based on the above gaseous starting material.

The pressure during mixing when introduced into the reaction space may be preferably higher in order to enhance the chemical contact among the above gaseous starting material, the substance (B) and the activated species (BA) of the substance (B), the gaseous substance (D), and the above gaseous halogenic oxidizing agent in probability. It is better to determine the optimum value suitably as desired in view of the reactivity. Although the pressure during mixing may be determined as described above, each of the pressures during introduction may be preferably $1 \times 10^{-7}$ atm to 10 atm, more preferably $1 \times 10^{-6}$ atm to 3 atm.

The pressure within the film forming space, namely the pressure in the space in which the substrate surface is effected by film formation is arranged may be set suitably as desired so that the precursors (E) under stated state generated in the reaction space and sometimes the precursors (F) formed as secondary products from said precursors (E) may contribute effectively to film formation.

The inner pressure in the film forming space, when the film forming space is continuous openly to the reaction space, can be controlled in relationship with the introduction pressures and flow rates in the reaction space of the gaseous starting material for formation of a deposited film, the activated species of the substance (B), said substance (D), and a gaseous halogenic oxidizing agent, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only spatially different, it is possible to effect differential evacuation or provide a large scale evacuating device having sufficient evacuating capacity as described above.

As described above, the pressure in the film forming space may be determined in the relationship to the introduction pressures of the gaseous starting material, the activated species of the substance (B) and/or the said substance (D), activated species (BA), and the gaseous halogenic oxidizing agent introduced into the reaction space. It is preferably 0.001 Torr to 100 Torr, more preferably 0.01 Torr to 30 Torr, optimally 0.05 to 10 Torr.

Further, when the substance (D) is activated in the activation chamber to be used exclusively for the substance (D), the inner pressure in said activation chamber is intimately related to the inner pressure in the reaction space, and it should desirably not be lower than the inner pressure in the reaction space.

Figure 1:
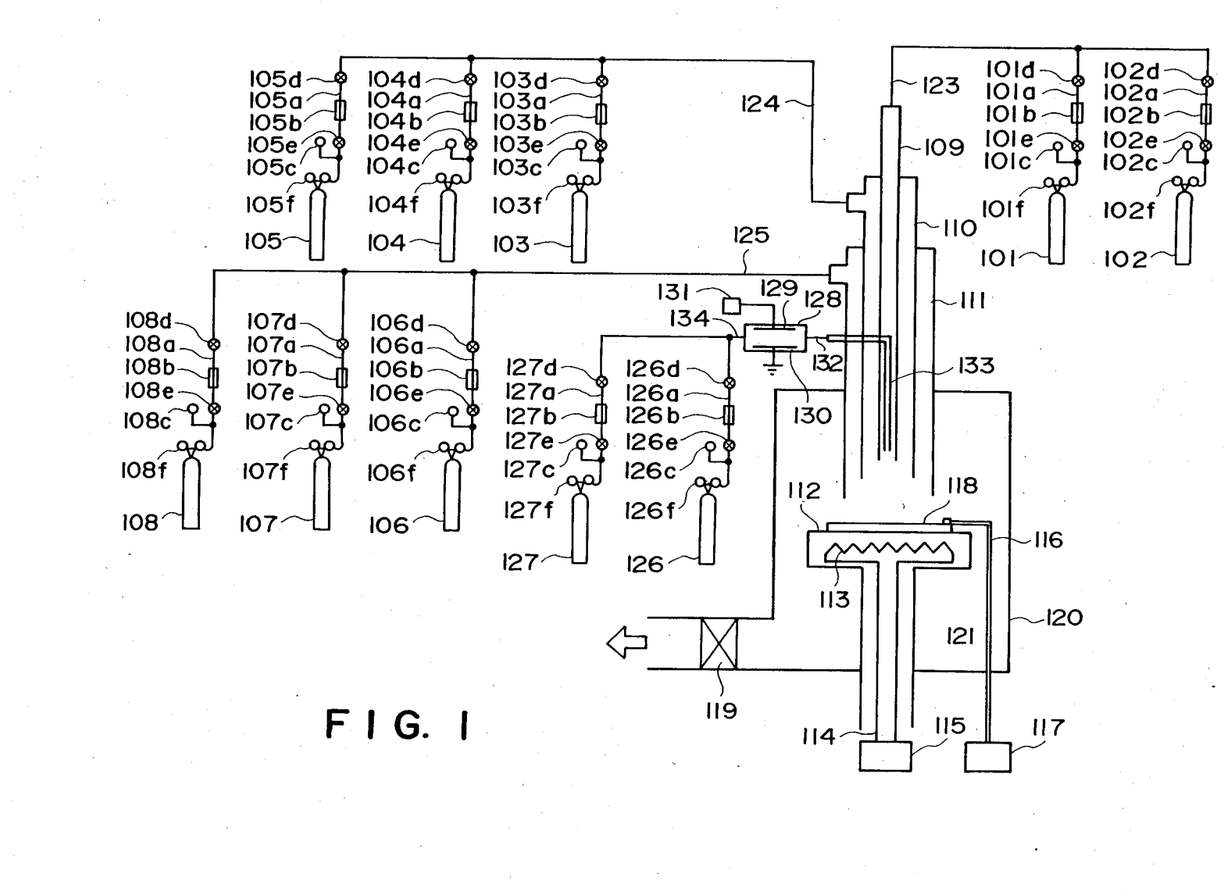
FIG. 1 is a schematic illustration of a film forming device used in Examples of the present invention.

As for the flow rate of the gases, it is necessary to design the flow type in view of the geometric arrangement of the gas introducing inlet, the substrate, and the gas evacuating outlet so that the starting material for formation of a deposited film, the substance (B) and the activated species (BA), and the halogenic oxidizing agent may be efficiently mixed during their introduction into the reaction space, the above precursors (E) may be efficiently generated, and film formation may be adequately carried out without trouble. A preferable example of the geometric arrangement is shown in FIG. 1.

As the substrate temperature (Ts) during film formation, it can be set suitably as desired individually depending on the gas species employed, and the kinds and the required characteristics of the deposited film formed. In the case of obtaining an amorphous film, it is preferably from room temperature to 450° C., more preferably from 50° to 400° C. Particularly, in the case of forming a silicon type crystalline deposited having better semiconductor characteristics and photoconductive characteristics, etc., the substrate temperature (Ts) should desirably be made 70° to 350° C. On the other hand, in the case obtaining a polycrystalline film, it should preferably be 200° to 650° C., more preferably 300° to 600° C.

As the atmosphere temperature (Tat) in the film forming space, it may be determined suitably as desired in relationship with the substrate temperature so that the above precursors (E) generated and the above precursors (F) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, In, Nb, Ta, V, Ti, Pt, Pd etc. or alloys thereof.

As insulating substrates, the folowing may be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers, and so on. At least one side surface of these insulating substrates is preferably subjected to treatment for imparting electroconductivity, and it is desirable to provide other layers on the side to which said electroconductive treatment has been applied.

For example, electroconductive treatment of a glass can be effected by providing a thin film of NiCr, Al, Cr, Mo, Au, Ir, In, Nb, Ta, V, Ti, Pt, Pd, $In_2O_3$, $SnO_2$, ITO ($In_2O_3+SnO_2$) or the like thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, In, Nb, Ta, V, Ti, Pt, etc., or by laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to sometimes give a film of inferior quality, and therefore it is preferable to use a substrate such that the difference in thermal expansion between both is small.

Also, the surface state of the substrate is directly related to the structure of the film (orientation) or generation of a stylet structures, and therefore it is desirable to treat the surface of the substrate so that a film structure and a film texture which give desired characteristics may be obtained.

FIG. 1 shows an example of a preferable device for practicing the method for forming a deposited film of the present invention.

The deposited film forming device shown in FIG. 1 is broadly classified into the four of a main device, an evacuation system, a gas feeding system, and an activation chamber.

In the main device, a reaction space and a film forming space are provided.

101-108, 126, and 127 are respectively bombs filled with the gases to be used for film formation, 101a-108a, 126a, and 127a are respectively gas feeding pipes, 101b-108b, 126b, and 127b are respectively mass flow controllers for controlling the flow rates of the gases from the respective bombs, 101c-108c, 126c and 127c are respectively gas pressure gauges, 101d-108d, 126d, 127d, 101e-108e, 126e, and 127e are respectively valves, and 101f-108f, 126f, and 127f are respectively pressure gauges indicating the pressures in the corresponding gas bombs.

128 is an activation chamber, 129 and 130 are electrodes, 131 is a high frequency power source, 132 an activated species feeding pipeline, and 133 an activated species introducing pipe.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of said pipeline. The pipeline for gas introduction has a quadruple concentric arrangement structure, having from the innerside a first gas introducing pipe 109 for introducing the gases from the gas bombs 101 and 102, a second gas introducing pipe 110 for introducing the gases from the gas bombs 103-105, a third gas introducing pipe 111 for introducing the gases from the gas bombs 106-108, and an introducing pipe 133 for introducing the activated species activated in the activation chamber 128.

For gas discharging to the reaction space of each gas introducing pipe, each position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123-125, respectively. The activated species (BA) are fed through the activated species feeding pipeline 132 into the activated species introducing pipe 133.

The respective gas introducing pipes, the respective gas feeding pipe lines, and the vacuum chamber 120 are evacuated to vacuum through the main vacuum valve 119 by means of a vacuum evacuating device not shown.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc. It is preferably several mm to 20 cm, more preferably 5 mm to about 15 cm.

113 is a heater for heating the substrate which is provided in order to heat the substrate to an appropriate temperature during film formation, to preheat the substrate 118 before film formation, or further to anneal the film after film formation.

The substrate heating heater 113 is supplied with power through a conductive wire 114 from a power source 115.

116 is a thermocouple for measuring the substrate temperature (Ts) and is electrically connected to the temperature display device 117.

The present invention described in more detail by referring to the following Examples.

EXAMPLE 1

Figure 4:
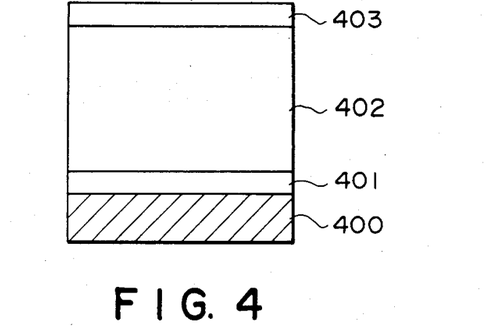
FIG. 4, FIG. 5 and FIG. 6 are schematic illustrations of the photosensitive member of electrophotography, the solar battery and the thin film transistor, respectively, used in the Examples of the present invention.

By use of the film forming device shown in FIG. 1, an electrophotographic photosensitive member shown in FIG. 4 was prepared according to the method for forming deposited film of the present invention.

The above photosensitive member for electrophotography (FIG. 4) was constituted of an aluminum substrate 400, a charge injection impeding layer (first layer p+ type, A-Si:H layer, 5 μm) 401, a photosensitive layer (second layer, non-doped A-Si:H layer, 18 μm) 402, and a surface protective layer (third layer, A-SiCH layer, 0.5 μm) 403.

The preparation procedure of the photosensitive member for electrophotography prepared under the conditions in Table 1 of this Example is to be described in detail with reference to FIG. 1.

An aluminum substrate 118 was placed in the vacuum chamber 120, and heated to 280° C. by the heater 113 for heating the substrate. After the aluminum substrate temperature became constantly 280° C., silane gas was introduced from the silane gas bomb 101 at 10 sccm, a gas mixture of helium and fluorine from the fluorine gas bomb 103 diluted to 10% with helium at 100 sccm through the introducing pipes 123 and 124 into the vacuum chamber 120, and also a gas mixture of diborane and helium from the gas bomb 106 of diborane diluted with helium to 1000 ppm through the introducing pipe 111 at 0.8 sccm into the vacuum chamber 120. Further, nitrogen monoxide gas from the nitrogen monoxide bomb 126 was introduced into the activation chamber 128 at 0.8 sccm, and nitrogen monoxide was activated by the power 50W from the high frequency power source 131 in the activation chamber, followed by introduction of the activated species through the introducing pipe 133 into the vacuum chamber 120.

Through the chemical reaction among the gases thus introduced into the vacuum chamber, a first layer was deposited to 5 μm on the aluminum substrate 118.

After deposition of the first layer to 5 μm, feeding of diborane and nitrogen monoxide were stopped, and silane gas and fluorine gas diluted with helium were introduced at the respective flow rates of 40 sccm and 400 sccm to form a second layer to 18 μm through the chemical reaction of the introduced gases. Then, the flow rate of silane gas was changed to 1 sccm and that fluorine gas diluted with helium to 10 sccm, and further methane gas from the methane gas bomb 127 was introduced into the activation chamber 128 at 100 sccm, wherein methane gas was activated at a high frequency power of 50W, followed by introduction of the activated species into the vacuum chamber 120.

Through the chemical reaction among the gases thus introduced, a third layer was deposited to 0.5 μm.

The film thickness of each sample was determined with a layer thickness measuring apparatus of alpha-step (produced by TENCOR Co.).

When the electrophotographic characteristics of the photosensitive member for electrophotography were measured, it was found that charging ability was improved by 30% and the sensitivity by 10%, as compared with that of the prior art.

EXAMPLE 2

Figure 2:
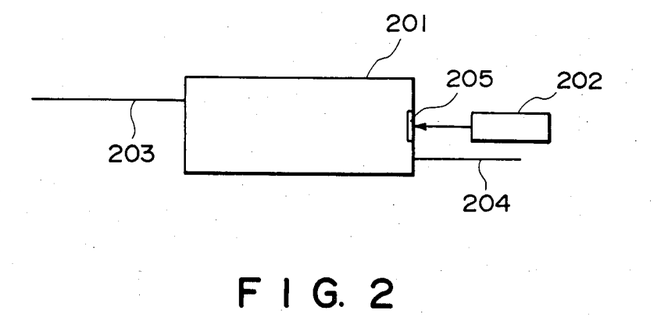
FIG. 2 and FIG. 3 are schematic illustrations of the activation devices used in Examples of the present invention.

In the deposited film forming device shown in FIG. 1, the activation chamber 128 was exchanged with an activation device utilizing optical energy of excimer laser shown in FIG. 2.

The activation device shown in FIG. 2 was constituted of an activation chamber 201, an excimer laser 202, a window 205 for irradiation of excimer laser, and a gas feeding pipeline 203 connected to the gas feeding pipeline 134 in FIG. 1, and also a gas feeding line 204 connected to the gas feeding pipeline 132 in FIG. 1.

By utilizing the deposited film forming device having the activation device utilizing optical energy as described above, a solar battery as shown in FIG. 5 was prepared according to the method for forming deposited film of the present invention.

Figure 5:
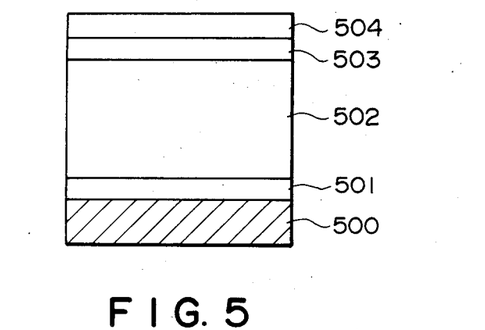

The above solar battery was constituted of 7059 glass (produced by Corning Co.) 500 having transparent electrodes vapor deposited thereon, a p-type amorphous silicon layer (first layer thickness 200 Å) 501, a non-doped amorphous silicon layer (second layer, thickness 7000 Å) 502, an n-type amorphous silicon layer (third layer, thickness 200 Å) 503, and an aluminum electrode 504.

During formation of the deposited films, the methane gas bomb in Example 1 was changed to an ethylene gas bomb and also the nitrogen monoxide bomb to a diborane bomb diluted to 100 ppm with helium to form deposited films.

Ethylene and diborane were mixed with each other and introduced into an activation chamber utilizing optical energy to be activated therein, and then introduced into the vacuum chamber 120. Following otherwise the same procedure as in Example 1 under the conditions shown in Table 2, deposited films were formed.

The film thickness of each sample was determined in the same manner as in Example 1.

The solar battery thus obtained exhibited a conversion efficiency improved by 10% as compared with the solar battery of the prior art.

EXAMPLE 3

Figure 3:
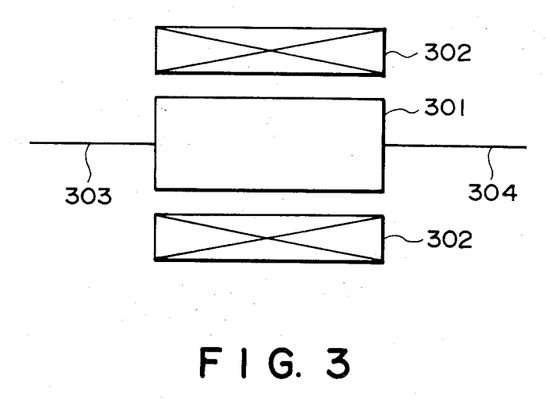

In the deposited film forming device in FIG. 1, the activation chamber 128 was exchanged with an activation device having an electric furnace shown in FIG. 3.

The activation device shown in FIG. 3 was constituted of an activation chamber 301, an electric furnace 302, a gas feeding line 303 connected to the gas feeding pipeline 134 in FIG. 1 and a gas feeding line 304 connected to the gas feeding pipeline 132 in FIG. 1.

By utilizing the deposited film forming device having the activation chamber utilizing heat energy as described above, a photosensitive member for electrophotography was prepared under the conditions in Table 3.

The film thickness of the first to the third layer in said photosensitive member for electrophotography were the same as in Example, and were measured in the same way as in Example 1.

The photosensitive member of this Example was prepared as follows. First, after the aluminum substrate temperature was made constantly at 250° C., the first layer was formed by the chemical reaction among the respective starting gases in Table 3 introduced into the vacuum chamber 120.

The second layer was formed by activating only the germanium gas of the gases in Table 3 in the electric furnace (700° C.) and introduced into the vacuum chamber 120, with the other gases being directly introduced into the vacuum chamber 120, thereby carrying out the chemical reaction among the gases.

The third layer was formed by the chemical reaction among the respective starting gases in Table 3 introduced into the vacuum chamber 120.

The image forming member for electrophotography prepared as described above was found to be improved in sensitivity by 10% as compared with that of the prior art.

EXAMPLE 4

Figure 6:
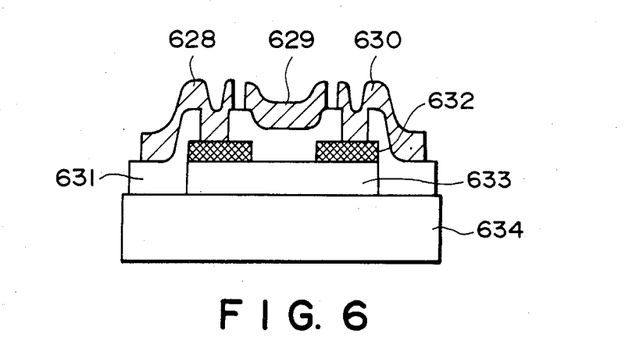

By use of the film forming device shown in FIG. 1, a thin film transistor (hereinafter called "TFT") as shown in FIG. 6 was prepared according to the method for formation of deposited film of the present invention.

The above TFT was constituted of 7059 glass (produced by Corning Co.) 634, an amorphous silicon layer (first layer thickness 7000 Å) 633, an amorphous silicon layer doped with phosphorus to a high concentration (second layer thickness 500 Å) 632, a silicon oxide layer third layer thickness 1000 Å) 631, and an aluminum electrode 629.

The film thickness of each sample was determined in the same manner as in Example 1.

In this Example, on deposition of the amorphous silicon layer doped with phosphorus to a high concentration, in the activation chamber 128 shown in FIG. 1, after the valence electron controller $PH_3$ was activated by RF glow discharge, the activated species formed from $PH_3$ was introduced into the deposition chamber 120 through the introducing pipe 133 to deposit an amorphous silicon layer doped with phosphorus to a high concentration. As to other conditions, semiconductor layers and insulating layers necessary for TFT were prepared under the conditions shown in Table 1.

The TFT of the present Example exhibited an on-off ratio improved by 10% as compared with that of the prior art.

As can be seen from the detailed description and the respective examples as set forth above, according to the deposited film forming method of the present invention, deposited films having uniform physical characteristics over a large area can be obtained with easy management of film quality at the same time as achievement of energy saving. Also, it is possible to obtain easily films excellent in productivity, bulk productivity, having high quality with excellent physical properties such as electrical, optical, and semiconductor properties, etc.

EXAMPLE 5

Films were formed on glass plates 7059 (produced by Corning Co.) for measuring the optical band gas (Eg opt) under the same conditions as the film formation conditions for the corresponding layer described in Tables 1–4 to prepare samples for measuring Eg opt.

Each sample was subjected to spectrophotometric determination with a spectrophotometer (produced by HITACHI-SEISAKUSHO No. 330). Eg opt was calculated from the results by the usual TAUC plot method.

The reference was prepared under the same conditions as those in the second layer of Table 1. Table 5 shows the results. As can be seen from Table 5, it has been found that each sample has an Eg opt adjusted according to the object.

TABLE 5

| Sample No. | Corresponding layer in Table | Eg opt (eV) |
|---|---|---|
| 1 | First layer in Table 1 | 1.85 |
| 2 | Third layer in Table 1 | 2.4 |
| 3 | First layer in Table 2 | 2.0 |
| 4 | Second layer in Table 3 | 1.5 |
| 5 | Third layer in Table 4 | 2.0 |
| Reference | Second layer in Table 1 | 1.7 |

TABLE 1

| Layer constitution | Starting materials | Flow rate (Sccm) | Activation method | Activation energy |
|---|---|---|---|---|
| First layer | $SiH_4$<br>$F_2/He = 1/10$<br>$B_2H_6/He = 1000$ ppm<br>NO | 10<br>100<br>2<br><br>0.8 | NO activated by RF glow discharge | 50 W |
| Second layer | $SiH_4$<br>$F_2/He = 1/10$ | 40<br>400 | — | — |
| Third layer | $SiH_4$<br>$F_2/He = 1/10$<br>$CH_4$ | 1<br>10<br>100 | $CH_4$ activated by RF glow discharge | 50 W |

TABLE 2

| Layer constitution | Starting materials | Flow rate (Sccm) | Activation method | Activation energy |
|---|---|---|---|---|
| First layer | $SiH_4$<br>$F_2/He = 1/10$<br>$B_2H_6/He = 100$ ppm<br>$C_2H_4$ | 20<br>200<br>20<br><br>10 | Gas mixture of $C_2H_4$ and $B_2H_6/He$ activated by optical energy | — |
| Second layer | $SiH_4$<br>$F_2/He = 1/10$ | — | — | — |
| Third layer | $SiH_4$<br>$F_2/He = 1/10$<br>$PH_3/He = 100$ ppm | — | — | — |

TABLE 3

| Layer constitution | Starting materials | Flow rate (Sccm) | Activation method | Activation energy |
|---|---|---|---|---|
| First layer | $SiH_4$<br>$F_2/He = 1/10$<br>$B_2H_6/He = 1000$ ppm<br>NO | 10<br>100<br>2<br><br>0.8 | — | — |
| Second layer | $SiH_4$<br>$GeH_4$<br>$F_2/He = 1/10$ | 40<br>1<br>400 | $GeH_4$ activated in electric furnace | heatd at 700° C. |
| Third layer | $SiH_4$<br>$F_2/He = 1/10$<br>$CH_4$ | 1<br>10<br>100 | — | — |

TABLE 4

| Layer constitution | Starting materials | Flow rate (Sccm) | Activation method | Activation energy |
|---|---|---|---|---|
| First layer | $SiH_4$<br>$F_2/He = 1/10$ | 20<br>200 | — | — |
| Second layer | $SiH_4$<br>$F_2/He = 1/10$<br>$PH_3/He = 1000$ ppm | 20<br>200<br>2 | — | — |
| Third layer | $SiH_4$<br>$F_2/He = 1/10$<br>NO | 10<br>10<br>10 | NO activated by RF discharge energy | 10 W |

What we claim is:

1. A method for forming a deposited film by introducing into a reaction space having a substrate a non-activated gaseous starting material for formation of the deposited film and a non-activated gaseous halogenic oxidizing agent selected from group consisting of $F_2$, $Cl_2$, $Br_2$ and $I_2$ and having the property of oxidation action on said non-activated gaseous starting material to form a deposited film on said substrate by a direct chemical reaction between said non activated gaseous starting material and said non-activated gaseous halogenic oxidizing agent, which comprises:

activating a gaseous substance (B) which includes a component to act as a band gap controller in an activation space separate from said reaction space to form an activated species; and introducing said activated species into the reaction space so as to form a mixture with said non activated gaseous starting material and said non activated gaseous halogenic oxidizing agent and form a deposited film controlled in band gap on said substrate without the use of external discharge energy in the reaction space.

2. A method for forming a deposited film according to claim 1, wherein luminescence is accompanied during formation.

3. A method for forming a deposited film according to claim 1, wherein said gaseous starting material is a chain silane compound.

4. A method for forming a deposited film according to claim 3, wherein said chain silane compound is a straight chain silane compound.

5. A method for forming a deposited film according to claim 4, wherein said straight chain silane compound is represented by the formula $Si_nH_{2n+2}$ (n is an integer of 1 to 8).

6. A method for forming a deposited film according to claim 3, wherein said chain silane compound is a branched chain silane compound.

7. A method for forming a deposited film according to claim 1, wherein said gaseous starting material is a silane compound having a cyclic structure of silicon.

8. A method for forming a deposited film according to claim 1, wherein said substrate is arranged at a position opposed to the direction in which said gaseous starting material and said gaseous halogenic oxidizing agent are introduced into said reaction space.

9. A method for forming a deposited film according to claim 1, wherein said gaseous starting material and said gaseous halogenic oxidizing agent are introduced into said reaction space through a transporting pipe of a multi-tubular structure.

10. A method for forming a deposited film according to claim 1, wherein said gaseous substance (B) contains an element for expanding band gap.

11. A method for, forming a deposited film according to claim 10, wherein said band gap expanding element is carbon, nitrogen or oxygen atom.

12. A method for forming a deposited film according to claim 1, wherein said gaseous substance (B) contains a band gap reducing element.

13. A method for forming a deposited film according to claim 12, wherein said band gap reducing element is germanium or tin atom.

14. A method for forming a deposited film according to claim 1, wherein said band gap controller is introduced into the activation chamber as diluted with at least one gas of $H_2$, He, Ne, Ar, Kr, Xe, and Rn.

15. A method for forming a deposited film according to claim 1, wherein discharging, light or heat energy is utilized as the activation method in said activation space.

16. A method for forming a deposited film according to claim 1, wherein a gaseous substance (D) for formation of a valence electron controller is introduced into the reaction space.

17. A method for forming a deposited film according to claim 16, wherein said gaseous substance (D) for formation of a valence electron controller is introduced after previous activation.

18. A method for forming a deposited film according to claim 16, wherein the valence electron controller is a semiconductive impurity of n-type or p-type.

19. A method for forming a deposited film according to claim 14, wherein the valence electron controller is an element in the group IIIA of the periodic table.

20. A method for forming a deposited film according to claim 16, wherein the valence electron controller is an element in the group VA of the periodic table.

* * * * *